United States Patent [19]

Schinella et al.

[11] Patent Number: 5,652,163

[45] Date of Patent: Jul. 29, 1997

[54] USE OF RETICLE STITCHING TO PROVIDE DESIGN FLEXIBILITY

[75] Inventors: Richard D. Schinella, Saratoga; Keith Chao, San Jose, both of Calif.

[73] Assignee: LSI Logic Corporation, Milipitas, Calif.

[21] Appl. No.: 357,728

[22] Filed: Dec. 13, 1994

[51] Int. Cl.⁶ .................................................. H01L 21/82
[52] U.S. Cl. ........................................................ 437/51
[58] Field of Search .............................. 437/51; 430/311, 430/312; 364/491; 355/53

[56] References Cited

U.S. PATENT DOCUMENTS

| | | | |
|---|---|---|---|
| 3,704,946 | 12/1972 | Brault et al. | 355/53 |
| 4,849,313 | 7/1989 | Chapman et al. | 355/53 |
| 4,869,998 | 9/1989 | Eccles et al. | 430/311 |
| 5,049,925 | 9/1991 | Aiton et al. | 355/53 |
| 5,055,383 | 10/1991 | Koblinger et al. | 430/312 |
| 5,087,533 | 2/1992 | Brown | 429/5 |
| 5,087,537 | 2/1992 | Conway et al. | 430/15 |
| 5,227,839 | 7/1993 | Allen | 355/53 |
| 5,255,051 | 10/1993 | Allen | 355/53 |

*Primary Examiner*—Tom Thomas
*Attorney, Agent, or Firm*—Poms, Smith, Lande & Rose

[57] ABSTRACT

A method and apparatus for forming large scale fields suitable for use in the fabrication of integrated circuit structures having submicron dimensions. The method includes subdividing the large scale field into a plurality of subfields along the boundaries of functional components forming a very large scale integrated circuit. Stitching the subfields into the large scale field is then substantially simplified since the number and dimensions of conductive interconnects between the functional components can be more easily accommodated.

7 Claims, 3 Drawing Sheets

1

USE OF RETICLE STITCHING TO PROVIDE DESIGN FLEXIBILITY

FIELD OF THE INVENTION

The present invention relates generally to integrated circuits, and, more particularly, to photolithographic reticles and a method and apparatus for fabricating multiple integrated circuit elements on a substrate die.

BACKGROUND OF THE INVENTION

As integrated circuit fabrication advances from very large scale integration (VLSI) to ultra-large scale integration (ULSI), semiconductor manufacturers continue to develop techniques to construct integrated circuits with structures having dimensions in the sub-micron range on a semiconductor substrate. Improvements in photolithographic processing techniques that can be employed to produce integrated circuits comprising several million transistors per die have substantially contributed to the miniaturization of active semiconductor devices to dimensions below a single micron. The fabrication of these semiconductor devices typically involves the transfer of circuit image patterns from a photolithographic reticle onto a photoresist layer covering a wafer of semiconductor material using an imaging lens apparatus. The reticle is often itself constructed from a substrate of silicon dioxide and is typically patterned with areas of differing transmissivity thereon, some of these areas being opaque and others being substantially transparent. Collectively, the patterned areas of the reticle represent either the positive or negative images of an integrated circuit structure depending on whether a negative or positive photoresist is utilized. After being properly positioned and aligned over the semiconductor wafer, the reticle is then subjected to electromagnetic radiation, typically in the ultraviolet region of the spectrum. The electromagnetic radiation passes through transparent portions of the reticle, striking portions of the photoresist layer on the wafer. The resist coating is then developed and etched so as to impart a positive or negative image of the reticle pattern onto the photoresist layer remaining on the wafer.

Conventional photolithographic methods of fabricating integrated circuits on a substrate typically involve stepping a reticle and imaging apparatus across a photoresist coated wafer and then repeatedly transferring the reticle image pattern to adjacent areas on the wafer. Each of the individual areas on the wafer containing the circuitry image is termed a die. Typically the wafer is cut or otherwise segmented at the end of the fabrication process so that the dies are separated from one another for subsequent packaging as individual integrated circuit chips. The region of the reticle bearing the circuity image pattern is commonly referred to as a reticle field, and the corresponding patterned region on each die is usually termed the substrate field, or chip field. Depending on the size of the substrate and individual die, a substrate may contain either a few dice or several dozen repetitions of the individual die pattern. The dice are usually arranged uniformly across the substrate in rows and columns. A wafer may undergo several imaging or photolithographic steps, depending on the complexity of the integrated circuit to be formed, with different reticles being employed at different times during the fabrication process to produce individual patterned layers on the die that collectively form the composite integrated circuit structure. This process is generally regarded as being well suited for fabricating integrated circuits having repeating structures such as DRAMs (Dynamic Random Access Memories) and SRAMs (Static Random Access Memories).

As integrated circuits become increasingly complex, however, the integrated circuit structures within an individual die have become significantly smaller and more dense. Larger reticles are often required to transfer larger and more complex circuit images to substrate fields of increased dimensions. Because of inherent image resolution limitations associated with conventional photolithographic processes, imaging and alignment errors are often introduced when fine line structures having sub-micron dimensions are produced on relatively large reticles. Current photolithographic imaging tools, as a consequence, are currently capable of patterning a field with a maximum surface area of only approximately 4.0 cm$^2$ if fine line structures with dimensions in the sub-micron range are included on the reticle.

The inherent limitations associated with producing relatively large reticles having structures with sub-micron dimensions have motivated integrated circuit manufactures to develop new methods of fabricating reticles with larger fields. One such method, known as "reticle stitching," is directed to producing larger reticle fields by sub-dividing the circuitry pattern, typically into four smaller subfields of equal dimension, and then stitching, that is, recomposing the subfield patterns together on a second reticle to form a large composite reticle field thereon. As illustrated in FIG. 1 of the drawings, a reticle 8 having a field 10 is shown as a composite field fabricated using a conventional stitching technique. Generally, reticle field 10 is a representation of the image patterns of an integrated circuit structure. The reticle 8 is constructed by first photolithographically patterning on separate reticles smaller subfields 12, 14, 16, and 18, with each subfield bearing a portion of the image pattern of the integrated circuit structure, and then stitching the subfields together along stitching boundaries 20, 22, 24, and 26 to form the composite reticle field 10. As discussed in U.S. Pat. No. 5,055,383, issued to Koblinger et al. (hereinafter referred to as "Koblinger"), the image patterns of subfields 12, 14, 16, and 18 of FIG. 1 that are transferred to reticle 8 must adjoin each other with a very high accuracy in order to avoid any alignment errors that otherwise occur with respect to the millions of fine line interconnections necessary to "re-connect" adjacent subfields along the stitching boundaries 20, 22, 24, and 26.

The manufacture of composite reticles formed by stitching together the interconnections between subfields in accordance with conventional techniques is generally regarded as a problematic process that currently provides unacceptably low yields. Further, because the fabrication of the reticle, or, more accurately, sets of reticles which together define a three dimensional integrated circuit structure, constitutes the primary expenditure with regard to the fabrication of integrated circuits, low reticle yields represent a significant loss of investment. There continues to exist in the integrated circuit manufacturing community a need to accommodate highly complex circuitry image patterns of powerful integrated circuits, and to overcome the inherent field size limitations associated with current photolithographic techniques. The present invention fulfills these needs.

SUMMARY OF THE INVENTION

In broad and general terms one aspect of the present invention provides a substantial increase in the functionality of an integrated circuit by fabricating on a single die a plurality of independent function regions representing discrete integrated circuit components that form a single integrated circuit from the function regions thereon. Another aspect of the present invention provides for increased reliability by producing fields bearing the image patterns of an integrated system of independent function regions that eliminates interconnections having sub-micron dimensions along the stitching boundaries between adjacent subfields that comprise the fields.

Still another aspect of the present invention provides for increased flexibility with respect to the design of reticle fields by establishing a library of standard reticles having fields representative of commonly used integrated circuit components or functional elements. The combination of a standard library of reticles representative of independent integrated circuit components or functional regions, together with the elimination of sub-micron interconnects along the stitching boundaries between adjacent reticle subfields, significantly increases the yield of composite reticles or extremely complex reticles. The fabrication of integrated circuits in accordance with the present invention also provides for the manufacture of complex integrated systems on large individual die, thereby greatly increasing the functionality of an individual integrated circuit.

In accordance with one aspect of the present invention, a set of photolithographic reticles are patterned to collectively represent the integrated circuitry structure of a single functional region. A reticle set may define a fully functional independent region, or function block, such as a microprocessor, RAM (Random Access Memory), ROM (Read Only Memory), a gate array, or some other form of customized logic. The reticle set defining each function block is preferably patterned to include a plurality of input and output lines for establishing signal connection with the respective input and output lines of other function blocks represented by other sets of reticles.

An important aspect of the present invention involves the interconnecting, or stitching, of the subfields defining individual function blocks to form a composite field representative of an integrated system. The input and output lines of the individual function blocks are preferably stitched together after the function blocks have been formed on the substrate die. One or more layers of conductive material are preferably formed over the plurality of function blocks on the die using additional reticles to interconnect selectively the respective input and output lines of the function blocks. Stitching together the relatively small number of input and output lines of the function blocks in accordance with the present invention eliminates any need to align and connect millions of fine line, or sub-micron, interconnects associated with conventional stitching processes.

Still another aspect of the present invention concerns the fabrication of large integrated circuit systems on a single wafer die in a manner that effectively overcomes image field limitations associated with conventional photo-patterning techniques. As previously discussed above, conventional photolithographic imaging tools are only capable of producing fields with a maximum area of approximately 4.0 cm$^2$ if fine line structures with dimensions in the sub-micron range are involved. Thus, conventional stitching techniques are capable of producing composite fields no larger than 4.0 cm$^2$. In contrast, the present invention effectively overcomes the inherent image field limitations by providing fields representative of individual function blocks having a small number of relatively wide input and output lines. Any sub-micron structures defining a function block are then included within one of the individual fields, so that stitching together the function blocks is accomplished simply and more reliably by interconnecting the larger input and output lines of the respective function blocks. By eliminating sub-micron interconnects at the stitching boundaries, and instead stitching together a minimal number of wide input and output lines, the fields representative of the independent function blocks may be enlarged to a maximum area of about 4.0 cm$^2$. Accordingly, significantly larger composite fields can be fabricated by stitching together two or more fields—each with a maximum field area of 4.0 cm$^2$—so as to form a complex integrated system on a single die.

Another aspect of the present invention involves providing a library of reticle sets that represent standard and perhaps commonly used function blocks, such as a microprocessor RAM, ROM, or other large standard cell. A designer can often satisfy a significant number of unique design requirements by integrating one or more standard devices, or elements, into an integrated circuit design, and then designing only the customized, or non-standard, circuitry needed to complete the design. A designer, in accordance with the present invention, may select the appropriate reticle sets representative of each standard device from a reticle library, and then need only fabricate a reduced number of new reticle sets required for the remaining non-standard or custom aspects of the integrated circuit not available in the library. The standard reticle sets may then be returned to the library for future use. In this regard, a substantial investment of money design time, and layout time commonly associated with conventional practices of repeatedly fabricating new reticles that represent standard function blocks or devices can be obviated. Moreover, defects associated with fabricating the composite reticles are substantially reduced through the use of the well-tested, standard reticle sets comprising the library, thereby increasing the yield of the composite reticles.

The novel features of the present invention will be better understood from the following detailed description, considered in connection with the accompanying drawings. It should be expressly understood, however, that the drawings are for purposes of illustration and description only, and are not intended as a definition of the limits of the present invention.

DETAILED DESCRIPTION OF THE PREFERRED EMBODIMENT

Figure 4:
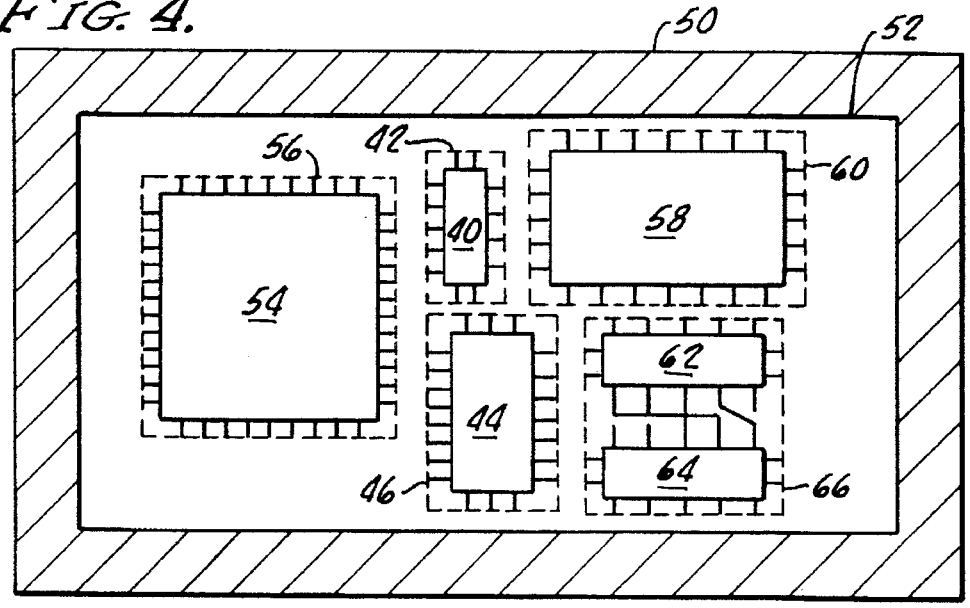
FIG. 4 is a top view of a composite field formed by stitching together the reticles representative of several individual function circuitry blocks in accordance with the present invention.

Referring to the figures, and more particularly to FIG. 4, there is shown on a substrate 50 including a field 52 representative of several function blocks 40, 44, 54, 58, 62, and 64, which together form a complex integrated system on the composite field 52. Preferably, substrate 50 is a semiconductor wafer substrate suitable for patterning into an integrated circuit. In accordance with one aspect of the present invention, individual sets of reticles are initially patterned with images representative of the circuitry structures comprising each of the function blocks 40, 44, 54, 58, 62, and 64. Each function block is preferably defined within a single field on the reticles. The image patterns comprising each of the individual reticle sets corresponding to the function blocks 40, 44, 54, 58, 62, and 64 are then transferred, using a photolithographic imaging process, to substrate 50 to form corresponding sub-fields 42, 46, 56, 60, and 66 respectively on the field 52. Upon completion of the initial transfer of function block image patterns from the individual reticle sets to the substrate 50, each of the function block patterns on the field 52 can be considered to be electrically independent with respect to all other function blocks on the field 52. Considering for example function block 54, a plurality of input lines and output lines extend outwardly from function block 54 and preferably terminate at predetermined locations along the perimeter of the sub-field 56. The input lines and output lines of the function blocks on field 52 are interconnected with respective input and output lines of other function blocks on field 52 during a subsequent fabrication process, as discussed below in greater detail.

An individual function block may, for example, define a microprocessor, a gate array, local memory, or other standard or customized logic circuitry. Each function block comprising field 52 defines a fully functional, individual integrated circuit component or device that, in accordance with conventional integrated circuit fabrication methodologies, might otherwise be packaged as individual chips. It should be noted that an individual sub-field on field 52, sub-field 66 for example, may define more than one function block thereon, such as the sub-blocks 62 and 64 shown in FIG. 4. The sub-blocks 62 and 64 are shown being interconnected within the sub-field 66 by a number of interconnect lines, some of which may have width dimensions in the sub-micron range. Sub-blocks 62 and 64 further include a plurality of input lines and output lines preferably terminating at prescribed locations along the perimeter of sub-field 66. Sub-micron structures are generally included within each subfield, with the subfields produced on the field 52 having varying dimensions depending on, for example, the complexity of the circuitry included within each sub-block.

Figure 5:
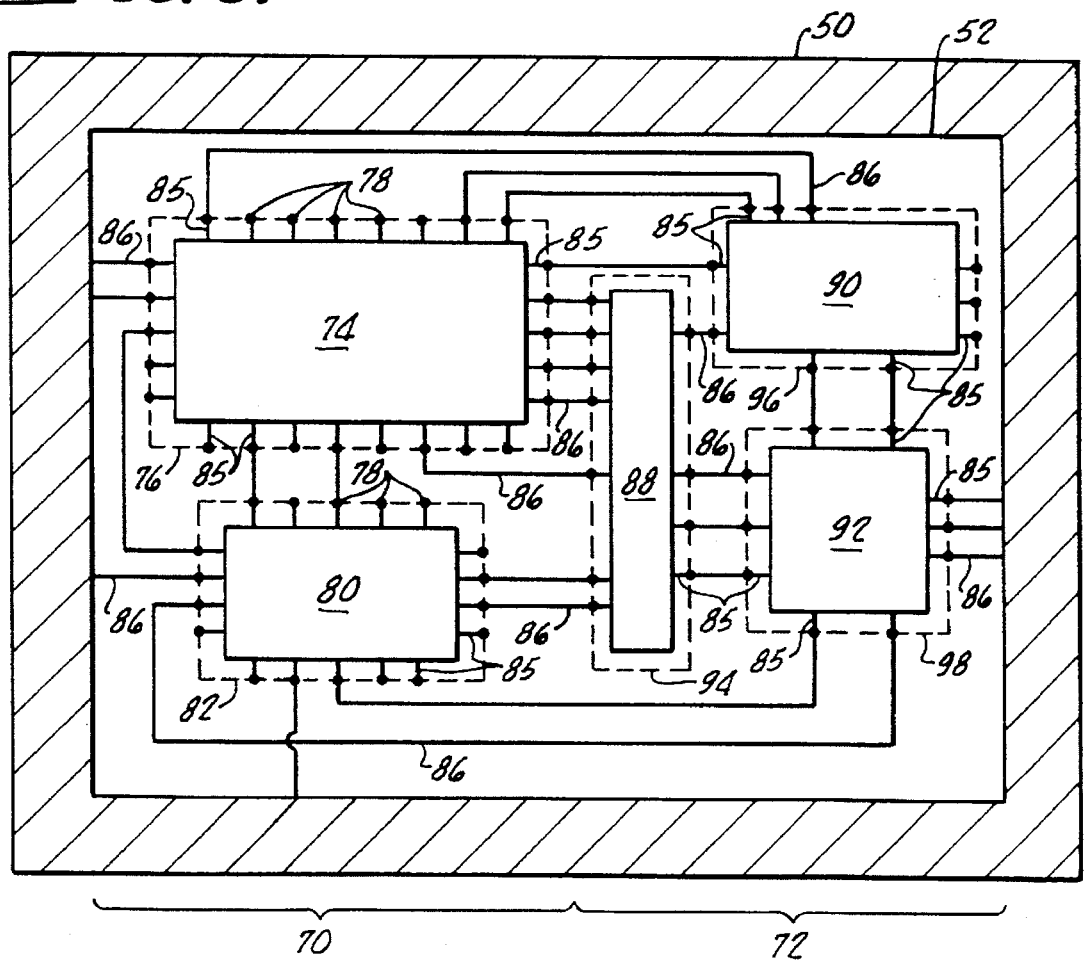
FIG. 5 is a top view of a composite field formed in accordance with the present invention by stitching together several individual functional blocks that are interconnected.

An important advantage of the present invention, illustrated in FIG. 5, involves a novel methodology of stitching together the sub-fields 76, 82, 94, 96, and 98 bearing the image patterns of the independent function blocks 74, 80, 88, 90, and 92 respectively that together form the composite field 52. Preferably, each of the function block patterns are transferred from their respective reticles to specific locations on substrate 50 to form the composite field 52 using a known photolithographic imaging process. After completion of this transfer procedure, each of the function blocks patterned on substrate 50 in accordance with the present invention may be considered to be electrically independent with respect to other function blocks on the field 52. Each function block, however, includes a plurality of input and output lines 85 that may be subsequently stitched together with respective input and output lines 85 of other function blocks comprising field 52. The input and output lines 85 of one or more function blocks may also be stitched in such a way as to extend to the periphery of the field 52 to form connections with contact pads (not shown) of the integrated circuit die later fabricated using the composite substrate 50.

Figure 1:
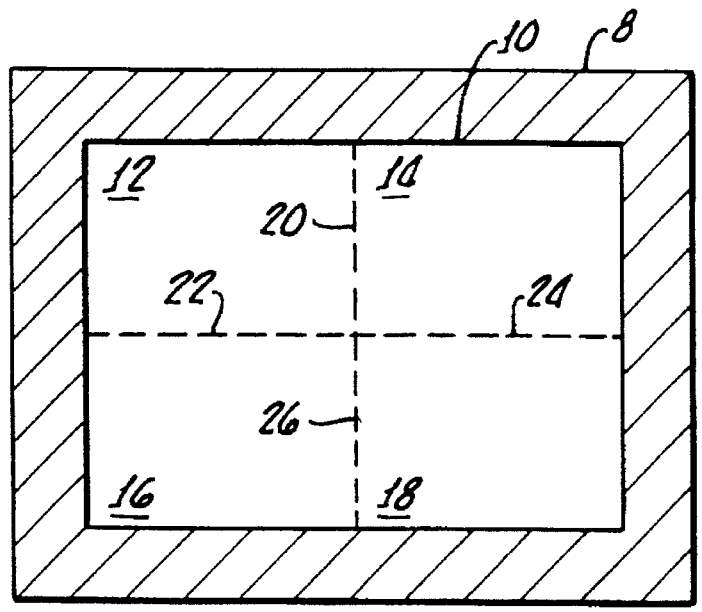
FIG. 1 is a top view of a conventional reticle with a composite reticle field formed by stitching several subfields together using conventional stitching techniques.
Figure 2:
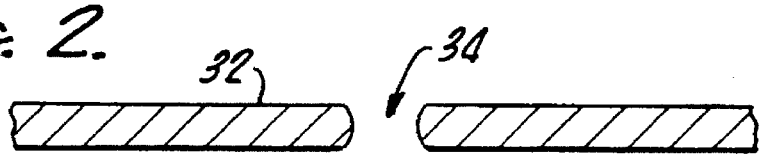
FIG. 2 is a top view of a conventional fine line interconnect pattern having sub-micron dimensions formed on a reticle using conventional photolithographic imaging techniques.
Figure 3:
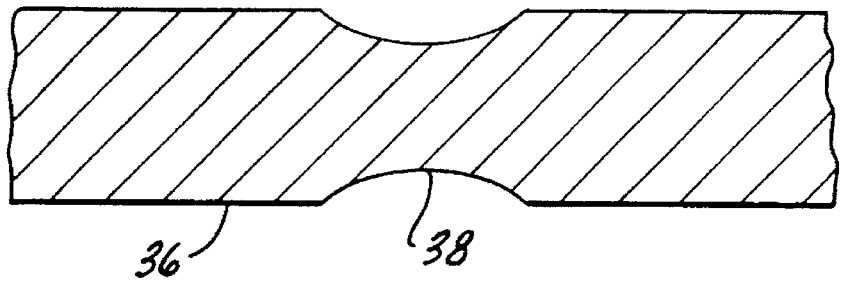
FIG. 3 is a top view of a broad line interconnect pattern formed on a substrate using conventional photolithographic imaging techniques.

The process of stitching, in accordance with the present invention, involves selectively interconnecting the input and output lines of a plurality of function blocks formed on the die. By way of illustration, and not limitation, the desired interconnections 86 may be fabricated by providing one or more layers of conductive material over the function blocks formed on the die. An insulating layer, such as a layer of oxide material, may first be formed over the function blocks prior to applying a first layer of conductive material. The conductive layer may then be patterned to form conductive pathways 86 that interconnect the respective input and output lines 85 of the function blocks 74, 80, 88, 90, and 92. Additional layers of conductive material, separated by layers of insulating material, may be subsequently formed over the first layer of conductive material to provide for a complex network of interconnections 85 between the function blocks. One or more reticles may be fabricated with a specific pattern of interconnect line images in order to produce the desired stitching pattern on a layer of conductive material. In a preferred embodiment, the input and output lines 85 and the conductive pathways 86 provided for stitching the function blocks together have a width dimension in excess of one micron, or generally greater than the overlay accuracy of the imaging system, for instance greater than 2 micron. Because of these relatively wide interconnects, minor alignment errors or superposition errors that typically occur during the stitching process have little effect on the integrity of the interconnections. For example, a superposition error may result in a constriction 38 or other deformation of the wide line interconnect 36 as illustrated in FIG. 3. The interconnect 36, however, will remain serviceable notwithstanding the deformation. The same superposition error would normally cause a failure or conductive gap in a sub-micron interconnection, such as the fine line interconnect 32 depicted in FIG. 2 associated with conventional reticle stitching techniques.

The substrate 50 shown in FIG. 5 further illustrates another important advantage of the present invention. Due in large part to the small number of relatively wide input and output lines 85, the input lines and output lines 85 of each function block on the field 52 can be terminated at fixed locations 78 with respect to the field boundaries. In one embodiment of the present invention, each input and output line 85 of each function block preferably terminates at a specific location along the perimeter of the corresponding sub-field. For example, the input and output lines 85 of function block 74 terminate at predefined locations 78 along the perimeter of the sub-field 76. Thus, when the function block patterns are transferred to a semiconductor substrate, interconnecting lines 86 may be patterned on one or more conductive layers above the function blocks to register with the predefined termination locations 78 of each input and output line 85. The input and output lines 85 may be connected with corresponding interconnecting lines 86 above the terminating locations 78 by known means, typically involving the formation of a vertical conductive pathway, or via, between the input line or output line 85 and the interconnect line 86. Thus, by establishing a standard convention describing the termination location of each input line and output line 85 provided for each function block, the stitching pattern comprising the conductive pathways 86 which are required to interconnect the input and output lines of the functional blocks 74, 80, 88, 90, and 92 can be automatically generated.

Figure 6:
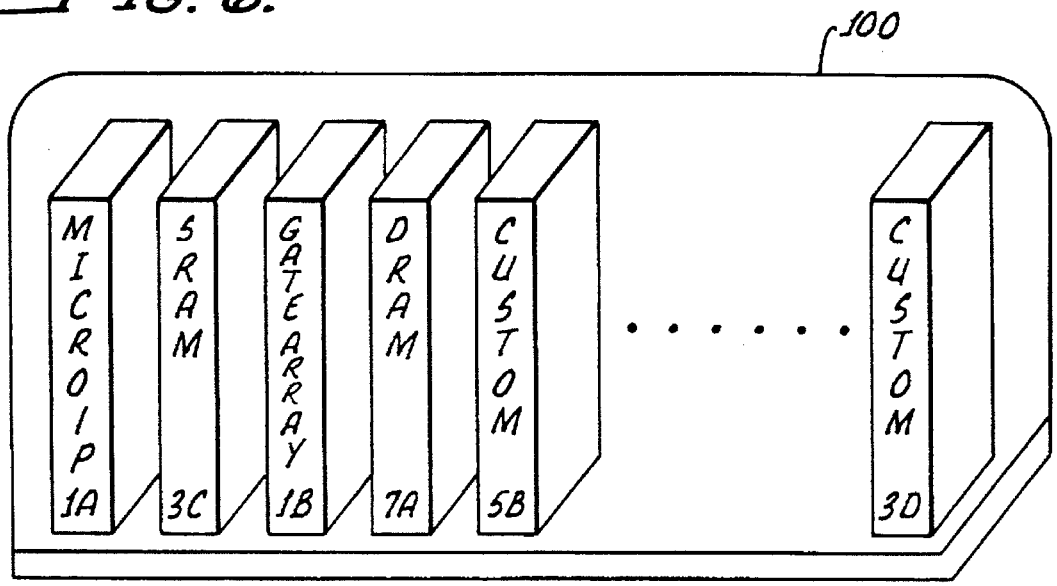
FIG. 6 shows a library of standardized reticle sets representative of integrated circuits or elements used commonly in the fabrication of VLSI components and systems.

The capability to automatically generate a specific stitching pattern to interconnect a system of function blocks comprising a field 52 is particularly useful when standard reticles are used in conjunction with non-standard or custom reticles to form a composite field 52. As further illustrated in FIG. 5, the field 52 is shown divided into a standard portion 70 and a custom portion 72. The standard portion of the field 52 comprises two function blocks previously fabricated on individual sets of reticles representative of function blocks 74 and 80. These standard reticles, in a preferred embodiment, would be available in a reticle library 100, as depicted in FIG. 6, and need not be re-fabricated to satisfy new design requirements. The reticle sets representative of function blocks 88, 90, and 92 comprising the custom portion 72 of the field 52 would have to be fabricated only for those function blocks not available in the library 100. Whenever feasible, the custom functional blocks 88, 90 and 92, may be constructed from standard reticles representative of less complex devices or circuit elements that may already be part of the library. After fabricating the reticle sets for the custom portion 72 of the design, the designer need only design the specific stitching pattern to provide the necessary interconnecting lines 86 to couple the custom portion 72 and the standard portion 70. The stitching pattern may then be automatically generated in the manner previously discussed above.

Returning to the individual function blocks 74, 80, 88, 90, and 92 illustrated in FIG. 5, one important advantage of the present invention concerns the increase in both complexity and size of a function block defined within its respective subfields 76, 82, 94, 96, and 98 on the field 52. Current photolithographic imaging tools, as previously discussed, are only capable of producing a field with a maximum area of 4.0 cm$^2$ where the field includes fine line structures with dimensions in the sub-micron range. A field defining an integrated circuit fabricated in accordance with a conventional reticle stitching technique is thus limited in size to 4.0 cm$^2$. In stark contrast, the function blocks 74, 80, 88, 90 and 92 formed on the field 52 in accordance with the present invention may each occupy fields having a maximum area of 4.0 cm$^2$, which in turn, may be utilized to fabricate a composite field 52 several times larger in area than 4.0 cm$^2$.

Figure 7:
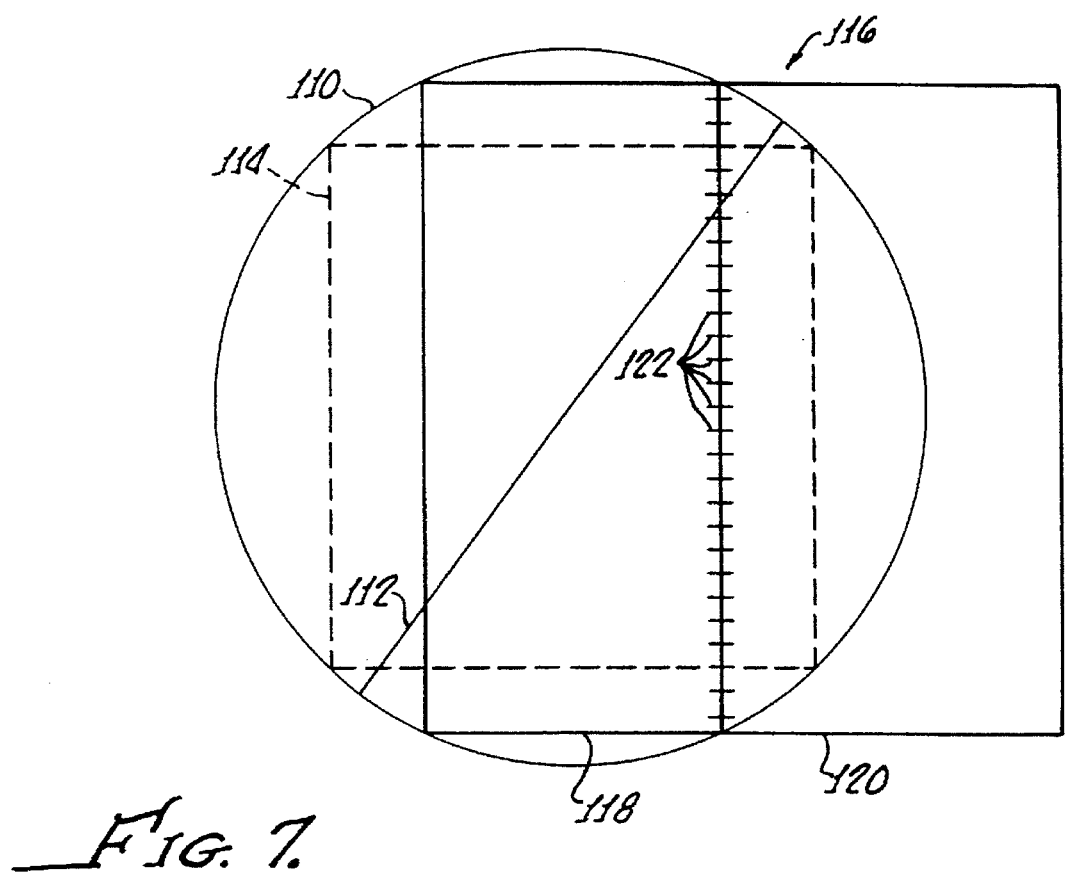
FIG. 7 illustrates an example of an increase in the functional area produced by the stitching methods of the present invention in relation to the size of a lens.

FIG. 7 illustrates an example of the advantages of the present invention. As shown, a lens 110 used for photolithographic processing has a particular diameter 112. A largest square 114, represented by the dashed box, illustrates the largest single field capable of fitting within the lens diameter 112. Thus, the lens diameter 112 determines, in large part, the field resolution for a single reticle. Attempts to increase the resolution include increasing the lens size or decreasing the field size. However, current typical lenses weigh on the order of 450 pounds and cost about one million dollars to produce. Thus, further increases to lens sizes are mechanically impractical and cost prohibitive. Similarly, producing smaller fields to increase resolution is expensive due to the costs of having to produce several fields to form a complete die while ensuring the reliability of the interconnects between the fields.

With the stitching methodology of the present invention, resolution can be increased without reducing the field size or increasing the lens size. An area 116 larger than the largest square 114 can be formed by stitching field 118 and field 120 with wide input and output lines 122 in accordance with the methods of the present invention. The resultant area 116 has increased the resolution producible with lens 110 without increasing the lens size or decreasing the field size. Further, in accordance with one embodiment of the present invention, field 118 suitably represents a standard field and field 120 suitably represents a custom field stitched together to form an integrated circuit, as described previously.

Accordingly, the complexity and functionality of each function block may be dramatically increased, resulting in large part from the ability to utilize a maximum available reticle field area for the integrated circuitry defining each function block. The function block 74, for example, may comprise a microprocessor which, if necessary, can be designed to occupy the entire surface area of the sub-field 76. Similarly, function blocks comprised of multiple sub-blocks, such as blocks 62 and 64 depicted in FIG. 4 for example, may likewise be designed to take advantage of the maximum available area of the subfield 66. Further, the dimensions of the field 52 can be substantially increased to accommodate the larger function blocks comprising the field 52 and subsequently used to produce complex integrated circuits on a substantially larger die. In this regard, the inherent photolithographic imaging limitations associated with conventional reticle stitching techniques are effectively overcome by the novel stitching methodology in accordance with the present invention. It is to be understood, however, that future improvements in photolithographic imaging techniques will likely provide the capability to pattern circuitry images having structures with sub-micron dimensions on reticle fields larger than 4.0 cm$^2$ in dimension. Accordingly, the size of the reticles defining the function blocks 74, 80, 88, 90, and 92 need not be limited to 4.0 cm$^2$, and may be increased in size without departing from the scope or spirit of the present invention. Such improvements in no way limit the novel features of the present invention.

Having discussed in detail the use of stitching to provide design flexibility in accordance with the present invention, multiple independent functional components or elements on a single die are appropriately interconnected to form a powerful and complex integrated circuit system. A single chip developed in accordance with the present invention, therefore, is capable of performing system level processing that would otherwise have to be accomplished by several independent chips fabricated using conventional methods.

The concept of developing systems of independent functional components on a single die may be referred to as "System Level Integration", or SLI by those skilled in the art. System level integration, in accordance with the present invention, provides integrated circuit manufactures with a number of advantages. A significant advantage, for example, concerns a substantial reduction in the number of individual chips that would otherwise be required to provide the equivalent functionality of a single multiple-component chip. A concomitant reduction in the area of a printed circuit board required for mounting a single chip, rather than several chips, is realized, thus allowing for increased miniaturization of electronic systems constructed using SLI technology.

Another advantage of the present invention involves the performance and reliability of an integrated circuit chip fabricated using the novel reticle stitching methodology of the present invention. An electronic system comprising one or more multiple-component chips, rather than numerous individual chips, can achieve higher operational speeds resulting in part from a reduction in the total number of interconnects made through the printed circuit board supporting the electronic system circuitry. The shorter interconnects between components integrated on a single die, as contrasted to the relatively long conductive pathways required to interconnect multiple components mounted on a printed circuit board, result in a substantial reduction of capacitive and inductive loadings associated with longer interconnects, thereby providing an increase in system processing speeds.

A substantial increase in the yield of electronic systems comprised of one or more multiple-component chips fabricated in accordance with the present invention can be realized through the elimination of numerous manufacturing defects that occur during the construction of electronic systems on a printed circuit board. For example, the defects associated with mounting and soldering chips onto the printed circuit board are significantly reduced since several individual chips can be replaced with a single multiple-component chip fabricated using the novel reticle stitching technique of the present invention. Moreover, a multiple-component chip is inherently more reliable because it dissipates considerably less power than an equivalent number of individual chips, and obviates the need for the many soldered wires, pins, cables, and other various support attachments associated with conventional packaging methods.

It will, of course, be understood that various modifications and additions can be made to the preferred embodiments of the present invention without departing from the scope or spirit of the present invention. For example, although the stitching methodology of the present invention has been described in terms of stitching on a semiconductor die substrate, the present invention is equally suitable for stitching on a reticle substrate. The interconnection problems normally associated with stitching reticle fields together to form a larger reticle field are reduced by the use of the present invention. Further, the formation of a larger composite reticle field merely adds an additional step before the transfer of the reticle field to a wafer substrate by standard photolithographic techniques.

Additionally, the use of wider interconnects at standard locations in the stitching of the present invention increases the available area for bonding pads on the wafer die. For example, as shown in FIG. 7, space exists between the interconnects 122. The space suitably provides additional area normally unavailable in fine line stitching techniques for placement of bonding pads by techniques well known to those skilled in the art.

Accordingly, the scope of the present invention should not be limited by the particular embodiments discussed above, but should be defined only by the claims set forth below and equivalents thereof.

What is claimed is:

1. A process of fabricating an integrated circuit comprising the steps of:
   providing a substrate, said substrate including at least one die thereon;
   providing a plurality of first reticle sets, each said first reticle set defining first fields representative of a function region, and said function region representations including a plurality of input line and output line representations;
   transferring the function region representations of said first fields of said first reticle sets to respective second fields of a second reticle set; and
   transferring the representations of the second fields of said second reticle set to said die; and
   interconnecting selected input lines and output lines of the function regions on said die.

2. The process of claim 1 further comprising the step of interconnecting selected input lines and output lines of the function regions on said die.

3. The process of claim 2 wherein the step of interconnecting selected input lines and output lines of the function regions on said die further comprises providing a patternable layer of conductive material over said function regions on said die.

4. The process of claim 1 wherein the step of transferring the representations of said first fields of said first reticle sets to respective second fields of a second reticle set further comprises recomposing the function region representations of the first reticle fields on respective second reticle fields to form a composite representation of said function region representations thereon.

5. The process of claim 1 wherein the step of transferring the representations of said first fields to respective second fields of a second reticle set further comprises positioning the input line and output line representations of each said function region representation at predefined locations on said second fields.

6. A process for forming an integrated circuit comprising:
   providing one or more first function region representations comprising at least one standard function region representation on a first reticle;
   providing one or more second function region representations comprising at least one custom function region representation on a second reticle;
   providing a plurality of input and output line representations at predefined locations of each of said first and second function region representations;
   transferring said first and second function region representations from said first reticle and said second reticle to a semiconductor wafer; and
   interconnecting selected input and output line representations between said first and second function region representations to form an integrated circuit on said wafer.

7. A process for forming an integrated circuit comprising:
   providing a custom function region representation on at least one first reticle;
   providing a standard function region representation on at least one second reticle;
   transferring said standard function region representation and said custom function region representation to a substrate; and
   interconnecting said custom region representation and said standard function region representation to form an integrated circuit.

* * * * *